United States Patent [19]

Trostyanetsky

[11] Patent Number: 4,489,310
[45] Date of Patent: Dec. 18, 1984

[54] TIME SLOT-CONTROLLING CIRCUIT FOR KEYBOARD SWITCH MODULE, AND APPARATUS INCORPORATING SAME

[75] Inventor: David Trostyanetsky, Columbus, Ohio

[73] Assignee: AT&T Technologies, Inc., New York, N.Y.

[21] Appl. No.: 383,079

[22] Filed: May 28, 1982

[51] Int. Cl.³ ............................ G06F 3/02; H04M 1/26
[52] U.S. Cl. ........................ 340/365 VL; 340/365 R; 340/365 S; 179/90 K; 400/485
[58] Field of Search ........ 340/365 VL, 365 R, 365 S; 179/90 K; 400/485, 479, 472

[56] References Cited

U.S. PATENT DOCUMENTS

| | | | |
|---|---|---|---|
| 3,274,345 | 9/1966 | Ham | 179/90 K |
| 3,956,745 | 5/1976 | Ellis | 340/365 VL |
| 4,099,246 | 7/1978 | Osborne | 340/365 R |
| 4,352,959 | 10/1982 | Warnecke | 340/365 VL |
| 4,454,501 | 6/1984 | Butts | 340/365 S |

*Primary Examiner*—James J. Groody
*Attorney, Agent, or Firm*—K. R. Bergum; R. P. Miller

[57] ABSTRACT

A time slot-controlling circuit (14, 14'), applicable for use with diverse types of keyboard-operated utilization devices or apparatus (18, 97, 98), such as in a pushbutton telephone (90), allows all (or pre-selected) keyboard-mounted key switches (24a–n, 24a'–h') to acquire a selected one of at least two different time slot-dependent operating states. This advantageously allows each key to initiate or control more than one work (or logic) function performed by an associated keyboard-operated utilization device or apparatus (18, 97, 98), as typically employed in a composite system or apparatus (10, 90). Such a two-state mode of operation is accomplished by each of two illustrative time slot-controlling circuit embodiments (14, 14') comprising a common time slot signal generator (21, 21'), which is responsively connected to a plurality of control signal generating channel selector circuits (22a–n, 22a'–h'). The signal generator (21, 21') includes an astable multivibrator (34, 34') coupled to a time slot controlling flip-flop (34). Each of the channel selector circuits (22a–n, 22a'–h') comprises a pair of gate-controlled flip-flops (64, 68), each of which is adapted to produce a key-initiated output control signal on only one of two output channels (e.g., A, or $A_2$ to $N_1$ or $N_2$) thereof at any given time. On which channel such a control signal is produced is dependent on whether the associated key (24a–n) has been actuated during the first ($T_1$) or second ($T_2$) time slot switching state period established therefor. Either a separate time slot signal responsive visual indicator, such as an LED (53) mounted in each key, when of the pushbutton type, or a single LED common to all of keys, provides an indication (e.g., LED ON or OFF) of which time slot operable state each switch is in at any given time.

14 Claims, 4 Drawing Figures

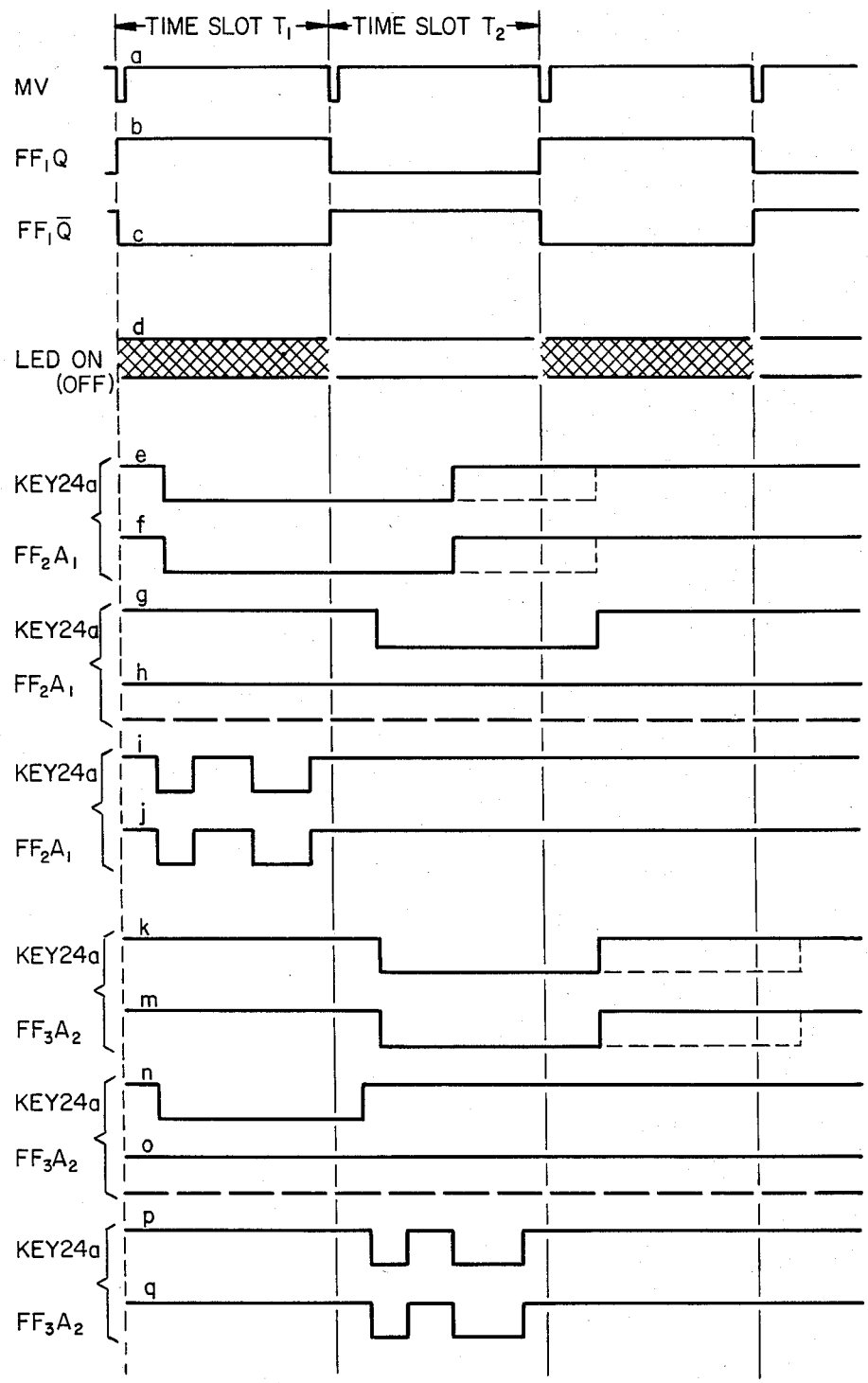

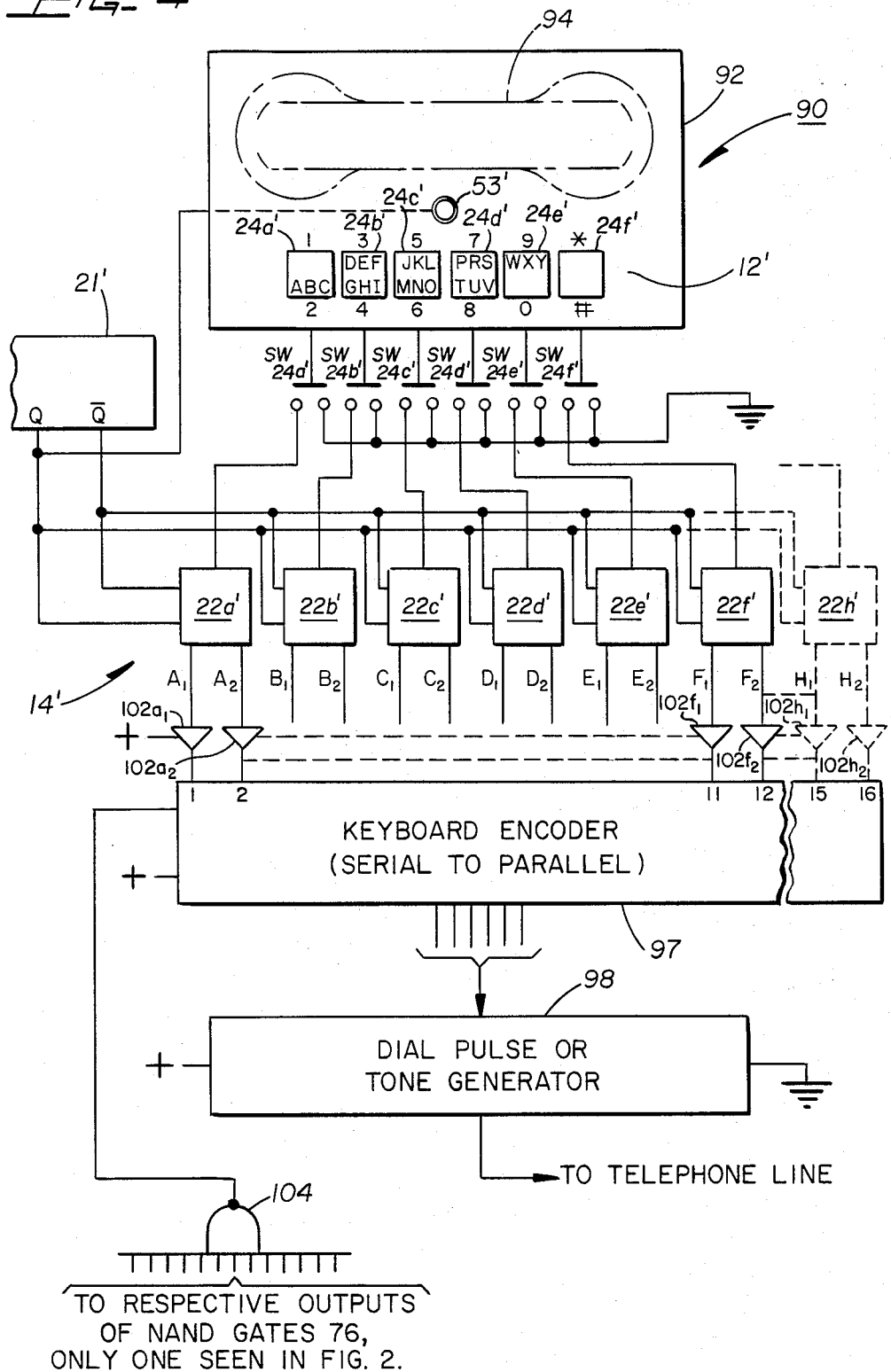

TIME SLOT-CONTROLLING CIRCUIT FOR KEYBOARD SWITCH MODULE, AND APPARATUS INCORPORATING SAME

TECHNICAL FIELD

This invention relates to keyboard modules and, more particularly, to time slot-controlling circuitry for use therein of the type that allows each keyboard key (or pushbutton) switch to acquire multiple time slot dependent operating states and, thereby, allow each key to initiate or control more than one work (or logic) function performed by an associated keyboard-operated device or apparatus.

BACKGROUND OF THE INVENTION

In many types of electronic devices and equipment, such as calculators, computers, CRT terminals, pushbutton telephones and the like, all hereinafter generally referred to simply as electronic apparatus, there has been an ever-increasing need for circuit-controlled keyboard switch modules of the type wherein each key (or pushbutton) is capable of initiating or controlling multiple work (or logic) functions performed by the apparatus. With the advent of large-scale integrated circuits, the above types of keyboard-operated apparatus, cited by way of example only, has progressively become more complex, and versatile, while at the same time allowing for the ever smaller packaging thereof, with the often attendant need for smaller keyboards. The emphasis on miniaturization, of course, has also advantageously generally resulted in a reduction in the costs of manufacturing such apparatus and, in many cases, lead to an improvement in the esthetics thereof, as packaged.

As a result of the continuously increasing work function capabilities built into diverse types of keyboard-controlled electronic apparatus, a serious problem has arisen wherein the number of work (or logic) functions that are capable of being performed therewith are often limited by the actual number of key (or pushbutton) type switches that can be practically placed on the associated housing-mounted keyboard. Compounding this problem, of course, is the fact that in any given keyboard, the keys (or pushbuttons) must be sufficiently spaced, and of adequate size, so as to allow an operator to conveniently and reliably actuate them rapidly and in any selected order.

One technique employed heretofore to allow each keyboard switch to selectively initiate or control two different work (or logic) functions has been to use a so-called "shift" or "prefix" key. Disadvantageously, such shift or prefix keys are in addition employed to actually initiate or control a specified work function and, hence, require additional, and normally high priority, space on a given keyboard. In addition, such shift or prefix keys, whether responsively connected electronically or mechanically (e.g., by a shuttle plate) to all or selected ones of the regular work function key (or pushbutton) switches, requires multiple key actuations (e.g., multiple button depressions) by an operator in order to initiate different predetermined work (or logic) functions per switch. This can readily contribute to operator fatigue and reduce efficiency, particularly over long operator work periods.

SUMMARY OF THE INVENTION

In accordance with the principles of the present invention, one preferred embodiment of a keyboard switch module incorporates a circuit for establishing multiple time slot-controlled key (or pushbutton) switch operating states. This advantageously allows each key (or pushbutton) switch to initiate or control a selected one of two (or more) work or logic functions performed by associated keyboard-operated apparatus. More specifically, in accordance with one illustrative keyboard module embodiment, the actuation of only a single key at the proper time, e.g., during a specific one of two alternating periods defined in accordance with a predetermined time-slot format, will electronically establish a control signal representative of the chosen one of two possible switching states for that key and, hence, the particular alpha/numeric character, for example, that has been pre-assigned to the selected operating state for that key.

In connection with all references to the word "key" hereinafter, it is intended to generally embrace actuable keyboard switches of both the depressible pushbutton type, and of the so-called "touch", or "membrane" types.

A two-state mode of operation for a keyboard module is preferably accomplished in part through the use of an astable multivibrator and a responsively coupled and toggled flip-flop. These devices, common to all of the time slot-controlled keys, indirectly establish the two possible operating states of the latter by time-slot conditioning a different pair of flip-flops responsively coupled to each of the keys. With all of these devices preferably being of the solid state type, they are not only of very small size, but relatively inexpensive, as packaged, in a composite keyboard switch module.

In a typical keyboard-controlled apparatus application, either a separate LED mounted in each key, when of the pushbutton type, or a single LED common to all of the keys, for example, may be employed to provide a visual indication (LED ON or OFF) of which time-slot mode and, hence, operating state, each key is in at any given time. It is appreciated that such a time slot-controlled keyboard switch is of particular advantage in situations where available keyboard space would restrict the number of possible pushbuttons to substantially fewer than the number of discrete work (or logic) functions capable of being performed by the apparatus, such as a pushbutton telephone.

BRIEF DESCRIPTION OF THE DRAWINGS

FIG. 3 is a waveform graph illustrating several voltage versus time signals generated by various devices of the composite time-slot controlling keyboard circuit, in response to the actuation of one representative keyboard key at different times during each of two alternating time-slot controlled switching state periods associated therewith, and FIG. 4 is a schematic block diagram of a composite keyboard-operated apparatus similar to that of FIG. 1, but illustrating more specifically how the apparatus may comprise an electronic telephone operated with only six pushbutton type keys as a result of incorporating a time slot-controlling circuit embodying the principles of the present invention.

DETAILED DESCRIPTION OF THE INVENTION

Figure 1:
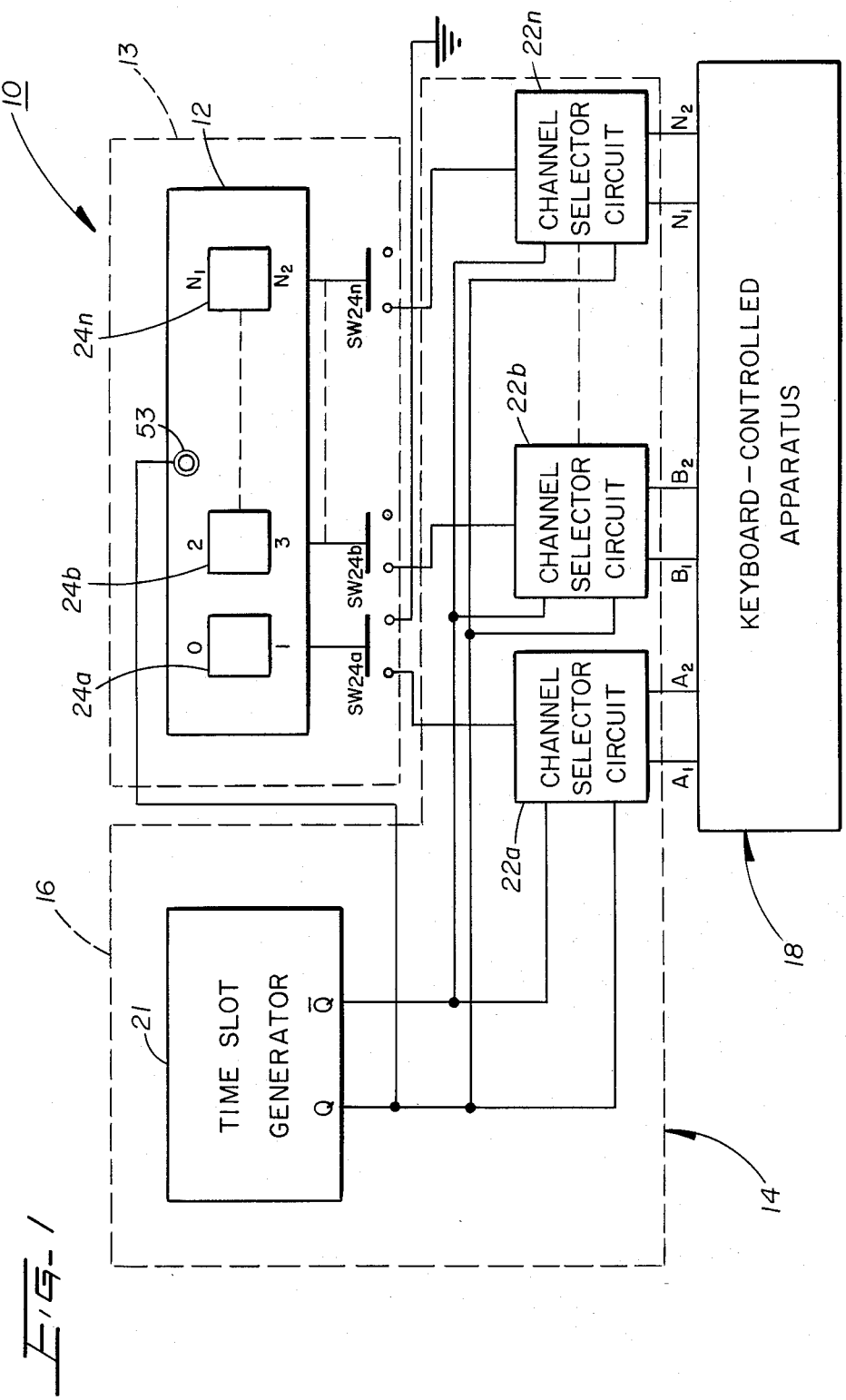
FIG. 1 is a simplified schematic block diagram illustrating the major portions of a representative composite keyboard-controlled apparatus wherein the keyboard includes a plurality of pushbutton type key switches and a time-slot controlling circuit for establishing two distinct and alternating operable switching states for each key.

With particular reference first to FIG. 1, there is depicted a composite keyboard-controlled system 10 which comprises a keyboard 12, shown within the dash-lined box 13, a time slot-controlling circuit 14, shown within the dash-lined box 16 and a keyboard-operated apparatus 18, which may comprise any one of the aforementioned types of electronic utilization devices or equipment, by way of example only.

The time slot-controlling circuit 14 includes a common time-slot signal generator 21, and a plurality of responsively connected control signal generating channel selector circuits 22a–n. Each of the latter circuits is adapted to produce a key-initiated control signal on only one of two output channels thereof at any given time. On which channel such a signal is produced is dependent on whether the associated key has been actuated during the first or second time slot-controlled switching state period established therefor.

In a typical operating application, the keyboard 12 would normally include a plurality of alpha/numeric (or other inditia-identified) key switches 24a–n, which are adapted to initiate or control predetermined work or logic functions performed by the responsively associated apparatus 18.

Figure 2:
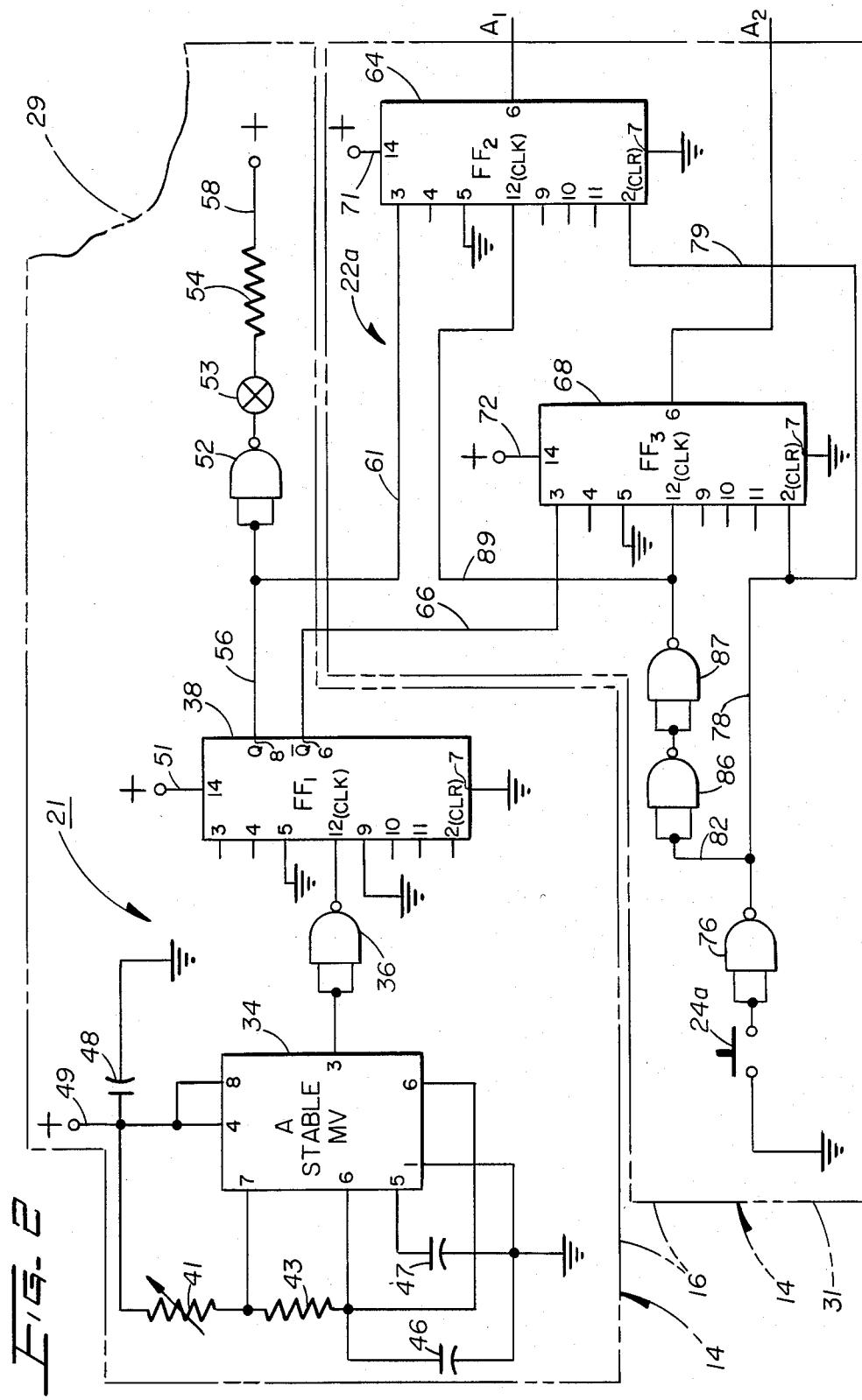
FIG. 2 is a schematic block diagram illustrating in greater detail the time slot-controlling circuit of FIG. 1 relative to the operation of just one keyboard-mounted key, the latter being representative of a plurality of like keys employed in any given keyboard switch module, with the time slot signal generating portion of the circuit that is common to all of the time-slot controlled keys, and the channel selector signal generating portion exclusively associated with each key, being isolated within separate dash-lined boxes.

With particular reference now to FIG. 2, the common time-slot signal generator 21 (shown only in block diagram form in FIG. 1) is shown schematically within the dash-lined box 29, with a representative one of the aforementioned channel selector circuits 22, namely 22a (also shown only in block diagram form in FIG. 1), being shown schematically within the dash-lined box 31. As illustrated, the time-slot signal generator 21 is comprised of an astable multivibrator 34, the output of which is connected through an NAND gate 36 to a time slot-controlling flip-flop 38 (FF$_1$). A variable resistor 41, and a fixed resistor 43, together with a capacitor 46, as connected to the multivibrator 34, adjustably establishes the switching or toggle rate of the latter in a conventional RC time constant-dependent manner. Two other capacitors, 47 and 48, function to de-couple the multivibrator to ground so as to enhance the operation thereof in a well-known manner.

In the illustrative embodiment, the astable multivibrator 34 and flip-flop 38 are respectively biased by positive 5 volt voltage sources 49, 51 (shown only symbolically). It is understood of course, that these voltage sources, as well as those associated with the other digital logical devices described hereinafter would, in practice, normally be replaced by a single voltage source common to all of such devices. In the interest of circuit clarity, and accepted circuit schematic illustration, voltage biasing terminals have not been shown for any of the NAND gates in the composite time slot-controlling circuit 14.

With the astable multivibrator 34 and time slot-controlling flip-flop 38 being individually wired, biased and interconnected, as shown, the former in one illustrative application is adapted to generate a train of negative output pulses of 50 ms duration each, at a rate of one per second (see waveform "a" in FIG. 3). These pulses, in turn, after being inverted in the NAND gate 36, toggle the flip-flop 38 at the same rate, thus, alternately generating high level ONE and low level ZERO pulses of one second duration each in a complimentary manner at the Z and $\bar{Q}$ outputs of the flip-flop (see waveforms "b" and "c" in FIG. 3). Considered more specifically, it is the alternating ONE state periods of the complimentary Q and $\bar{Q}$ output pulse trains that respectively establish the two predetermined time slots $T_1$ and $T_2$ associated with each keyboard key 24 a–n in the illustrative embodiments disclosed herein.

A NAND gate 52, a lamp 53, such as of the LED type, and a resistor 54 are serially connected by a line 56 to the Q output of the flip-flop 38, and suitably biased by a source 58, so as to provide a visual indication of each successive "first" time slot period ($T_1$) established by the keyboard control circuit 14 (see timing bar graph "d" in FIG. 3). As thus employed, the lamp 53, when not energized, similarly provides a visual indication of each successive "second" time slot period ($T_2$). Should it be desired in a given application to utilize a separate lamp to indicate when each time slot period $T_2$ is established for the keys 24, that may be readily accomplished by simply providing a second gate-controlled lamp (not shown) connected to the $\bar{Q}$ output of the flip-flop 38.

It should also be readily apparent, of course, that when two lamps, or LEDs, each common to all of the keys 24 are employed, they could be color-coded so as to further differentiate between the two time slot periods $T_1$ and $T_2$ associated with each key. It is likewise obvious that each key, when of the pushbutton type, could have a separate LED (or a pair of color-coded LED's) incorporated in the button housing thereof, if desired, with all of the key-mounted LEDS associated with a given time slot period being wired in parallel.

Both the astable multivibrator 34 and the responsively toggled flip-flop 38, as well as all of the other devices incorporated in the preferred embodiment of the keyboard controlled system 10, are preferably of the solid state type. By way of example only, the actuable multivibrator 34 may be of the type sold by the National Semiconductor Corporation under the code number LM555, with the flip-flop 38 being of the type sold by the Fairchild Division of Schlumberger Ltd., under the code number 7470. The NAND gate 36 may also be of the type sold by the Fairchild Division of Schlumberger Ltd., under the code number 7400, and in the illustrative embodiment actually comprises one of four such devices packaged as a unit, and all employed in the time slot-controlling keyboard circuit 14. The NAND gate 52, employed to effect the selective energization of the lamp 53, may similarly be of the type sold by the last mentioned company under the code number 7405 and, as purchased, actually comprises one of a six gate package. It is understood, of course, that there are a number of integrated circuit manufacturers who sell similar digital logical devices with essentially identical operating characteristics, in both single and multiple unit packages. It should also be understood that when the ganged input NAND gates are only employed to perform a logic inversion function in the time slot-controlling circuits embodied herein, they may be replaced by single input invertors, for example, or by ganged input NOR gates, with equal functional end results.

With reference again to the time slot-controlling flip-flop 38, the Q output thereof, in addition to being connected by the line 56 to the LED 53, is applied over a line 61 to a data input (terminal 3) of a flip-flop 64 (FF$_2$). Similarly, the compliment $\overline{Q}$ output of the flip-flop 38 is applied over a line 66 to the data input (terminal 3) of a flip-flop 68 (FF$_3$). The flip-flops 64 and 68 may be identical to the flip-flop 38 and, as such, would also normally be connected to positive five volt voltage sources, shown only symbolically by terminals identified by the reference numerals 71 and 72, respectively.

As illustrated in FIG. 2, the representative key (or pushbutton) 24a is grounded on one side, with the other side being connected to a NAND-gate 76, the output of which is connected over a line 78 to the Clear (CLR) input of the flip-flop 68, and over a branch line 79 to the Clear (CLR) input of the flip-flop 64. The output of the NAND-gate 76 is also connected over a branch line 82, including two serially connected NAND-gates 86, 87, to the Clock (CLK) input of the flip-flop 68, and over a branch line 89 to the Clock (CLK) input of the flip-flop 64. The primary function of the two serially connected NAND gates 86 and 87 is to provide the requisite time delay for the common key-initiated Clock signals which are fed therethrough to each of the flip-flops 64, 68, relative to the time slot generated pulses applied to the respective data inputs thereof.

Having described the various devices employed in both the common time slot signal generator 21, and in one representative channel selector circuit 22a of the composite keyboard controlled system 10, a general mode of operation of the latter will now be described, with particular reference being made to FIG. 2, in conjunction with the waveform graph of FIG. 3. Prior to the actuation of any of the keyboard keys 24a–n, it will be recalled that the astable multivibrator 34 generates a train of negative spike-like output pulses, such as of 50 ms duration each, once each second (or any other desired multiple number of seconds) represented by waveform "a" in FIG. 3. This train of output pulses, when applied through the NAND-gate 36 to the flip-flop 38 (FF$_1$), results in the latter, as wired and biased, being toggled once each second in the illustrative example so as to alternately generate the high level "one" timing pulses of one second duration each at the Q and $\overline{Q}$ outputs thereof (see waveforms "b" and "c" in FIG. 3). As previously noted, it is these alternating output pulses that establish the T$_1$ and T$_2$ time slot-switching state periods for each of the keys 24a–n. The timing bar graph "d" in FIG. 3 illustrates the T$_1$ time slot periods when the LED 53, connected to the Q output of the flip-flop 38, is energized in the illustrative circuit embodiment.

At the instant any key (or pushbutton) 24, such as 24a depicted in FIG. 2, is actuated, and assuming that such actuation takes place during any "first" time-slot period T$_1$, not only is a high level "one" timing pulse from the Q output of the flip-flop 38 applied over the line 61 to the aforementioned data input (terminal 3) of the flip-flop 64, but high level "one" input signals are applied from the output of the NAND gate 76 to both the Clear (CLR) and Clock (CK) inputs of both flip-flops 64 and 68 (FF$_2$ and FF$_3$). With only the flip-flop 64 receiving a time slot-defining "one" data pulse from the Q output of the flip-flop 38 at that time (during T$_1$), the former flip-flop is triggered from a reset to a set state. This causes the output on channel A$_1$ of the flip-flop 64 to change from a normally quiescent high level "one" to a low level "zero" control signal state. As best seen in waveforms "f" and "i" in FIG. 3, such a triggered change of the channel A$_1$ output occurs only at the leading edge of a key-initiated "one" signal (or pulse) when applied to the Clock (CLK) input of the flip-flop 64 during a T$_1$ time slot period. Each such key-initiated channel A, "zero" output control signal in the illustrative embodiment represents the numeric character "0", for example, assigned to the pushbutton-type key 24a in the keyboard 12 of FIG. 1, and such control signal is responsively applied to the utilization apparatus 18.

It should be also noted, as readily seen from the waveform "c" in FIG. 3, that during each alternate time slot period T$_1$, regardless whether a key, such as 24a, has been actuated or not, only a low level "zero" timing pulse is applied over the line 66 to the data input (terminal 3) of the flip-flop 68 (FF$_3$). As a result, the flip-flop 68, as wired, will not produce a low level "zero" control signal on the output channel A$_2$ thereof, whether high level "one" (key-initiated) or low level "zero" (non-key established) input signals are commonly applied to the Clear (CLR) and Clock (CLK) inputs of that flip-flop during any given T$_1$ time-slot period. This result is readily seen from an examination of waveforms "m", "o" and "q" in FIG. 3.

Conversely, during each T$_2$ time slot period, the flip-flop 38 is toggled such that the $\overline{Q}$ output thereof is at a high level "one" state, and upon that output being applied as a data input (on terminal 3) of the flip-flop 68, will condition the latter to be reset, upon the actuation of the associated keyboard key, such as 24a. The actuation of the latter key during a T$_2$ time slot, as in the case described above relative to a key being actuated during a T$_1$ time slot, will result in high level "one" signals being applied to both the Clear (CLR) and Clock (CLK) inputs of the flip-flop 68. The actual point in time at which the flip-flop 68 changes from a reset to a set condition occurs, as in the case described above for the flip-flop 68, at the leading edge of the key-initiated "one" signal applied to the Clock (CLK) input thereof, as indicated in waveforms "m", "o", and "q" of FIG. 3. When set, the output control signal on channel A$_2$ of the flip-flop 68 changes from a high level "one" to a low level "zero" state. In the illustrtive composite keyboard controlled system 10 of FIG. 1, such a key-initiated "zero" output on channel A$_2$ of the channel selector circuit 22a represents the numeric character "1". It is understood, of course, that the key-initiated "zero" outputs respectively appearing on channels A$_1$ and A$_2$ during the T$_1$ and T$_2$ time slots, respectively, could represent any other desired, predetermined alpha/numeric characters, as well as any other type of logic or work function—identifying indicia.

The dash-lined extensions of the waveforms "e" and "f" in FIG. 3 indicate that once a given key 24a–n is actuated during any given T$_1$ time slot period, the resulting low level "zero" channel A$_1$ output of flip-flop 64 (FF$_2$) will remain in that state until that key is ultimately released. This is true regardless of whether any such given key 24 is ultimately released during either a subsequent T$_1$ or T$_2$ time slot period. The dash-lined extensions of the waveforms "k" and "m" indicate that the same key-initiated channel $A_2$ output conditions apply with respect to the flip-flop 68 ($FF_3$).

From the foregoing, it is seen that by simply incorporating a separate channel selector circuit 28 (as illustrated in FIG. 2) for each work (or logic) function key employed in a given keyboard 12, any number of dual time slot-controlled keys may be employed in a given composite keyboard-controlled system 10, as illustrated only generally in FIG. 1. In this connection, it should also be understood that the key-initiated, and switching state representative, channel selector outputs $A_1$, $A_2$ to $N_1$, $N_2$ have universsal application in controlling many different types of utilization apparatus 18, illustrated only symbolically in FIG. 1. In many cases, such utilization apparatus would often include a conventional serial-to-parallel encoder, such as of the 16 line input to four bit digital output type (see FIG. 4), employed in conjunction with many diverse types of data entry and utilization devices or apparatus, such as calculators, computers, electronic typewriters, CRT terminals, electronic-type pushbutton telephones and the like.

FIG. 4 illustrates a second embodiment of the invention comprising an electronic pushbutton-type telephone 90 which incorporates a time slot-controlling circuit, identified generally by the reference numeral 14'. As the major portions of the latter circuit, as shown only in block diagram form, are identical to those in the embodiment of FIGS. 1 and 2, they are correspondingly identified by identical, but primed, reference numerals, and include a time slot signal generator 21' and six control signal-generating channel selector circuits 22a'-f.

The telephone 90 further comprises a telephone housing 92, a handle portion 94, including conventional transmitter and receiver units mounted therein (neither seen), a housing-mounted keyboard 12', comprised of six pushbutton type keys 24a'-f, and utilizaton apparatus in the form of a keyboard encoder 97 and a conventional electronic dial pulse and/or multi-tone generator module 98. The latter, of course, is responsive to the selective actuation of any of the keys 24a'-f, and to the resulting control signals produced at the associated channel selector circuit outputs $A_1$, $A_2$ to $F_1$, $F_2$, to effect the generation of the corresponding dialed number pulse trains, or dial tones, as required for a given type of telephone subscriber service. It should be appreciated that the encoder 97 may often be incorporated in the electronic dialer module 98 as purchased from any one of a number of integrated circuit and/or telephone device manufacturers. By way of example only, various types of such electronic dial pulse and/or tone generator modules for use with pushbutton type keyboards are available from Intersil, Inc., and American Microsystems, Inc.

In view of the correspondence between the time slot generating circuit 14 of FIG. 1 and circuit 14' of FIG. 4, in terms of construction and mode of operation, it will suffice to simply state at this point that the circuit 14' allows the use of only five pushbutton type keys 24a'-e' to provide the necessary alpha/numeric characters required for conventional pushbutton-dialing. In contrast, a conventional pushbutton telephone normally requires a minimum of 10 pushbuttons. A sixth pushbutton type key 24f' is employed in the illustrative telephone embodiment so as to perform two additional pre-determined auxiliary functions, by way of example only.

It is obvious, of course, that when a 16 line input to four bit digital output serial-to-parallel encoder 97 is employed, as depicted in FIG. 4, a maximum of eight pushbutton type keys 24' could be employed as readily as the six illustrated, by simply including two additional channel selector circuits 22' of the type depiected in the dash-lined box 31 of FIG. 2. The eighth one of such an expanded array of channel selector circuits is identified by the reference numeral 22h, and is shown in phantom form as being optional in FIG. 4.

In conjunction with the operation of many conventional types of encoders, it may often be desirous to apply amplified input signals thereto. To that end, the channel selector control signals on output channels $A_1$, $A_2$ to $H_1$, $H_2$ in the illustrative embodiment of FIG. 4 are optionally fed through respectively associated solid state amplifiers 102 $a_1$, $a_2$ to $h_1$, $h_2$. The time slot-controlling circuit 14' of FIG. 4 also illustrates the optional utilization of a NAND gate 104 to provide a high level gated pulse to the encoder 97 during any period when one of the pushbuttontype keys 24' are actuated. Such key-initiated gated pulses may often be beneficial in certain applications to facilitate the operating stability of the encoder during each serial-to-parallel signal transformation performed therein in response to each serially applied input.

In all other respects, the time-slot controlling circuit 14' incorporated in the composite electronic telephone 90 functions in the same manner as in the more generalized, universal system 10 illustrated and described in detail herein in connection with FIGS. 1 and 2.

While a preferred time slot-controlling circuit has been described herein for establishing multiple operative key switching states in both a circuit-controlled keyboard switch module, and in a composite utilization apparatus employing such a module, such as in the form of an electronic pushbutton-type telephone, it is obvious that various modifications may be made to the present illustrative embodiments of the invention, and that a number of alternative related embodiments could be devised by one skilled in the art, without departing from the spirit and scope of the invention.

What is claimed is:

1. A time slot-controlling circuit for use in increasing the number of possible operative switching states for the keys of a keyboard switch module, said circuit comprising:

first means, when voltage biased, for generating at least two repetitive and alternating time slot-controlling signals, each of which is of predetermined duration and logic state, and defines a separate time slot period, and second means, including a plurality of channel selector circuit means, each of the latter means producing an output utilization control signal on a time slot associated one of two output channels thereof in response at least conditionally to both a selected one of said time slot-controlling signals and a Clock-defining signal being applied thereto, the latter signal being generated by said second means, and initiated by a pre-selected key switch of an associated keyboard, when such a key switch is responsively connected to an associated one of said channel selector circuit means, and actuated during a selected time slot period, each resulting channel output control signal thereby being representative of an exclusive one of at least two distinct actuated-key switching states, and of any visually discernable characters pre-assigned to such an exclusive switching state.

2. A time slot-controlling circuit in accordance with claim 1 wherein said first means includes a multivibrator and a flip-flop, with the output of said multivibrator toggling said flip-flop such that the latter alternatively produces at least said two time slot-controlling signals.

3. A time slot-controlling circuit in accordance with claim 2 wherein each of said channel selector circuit means includes two flip-flops and gating means, the latter producing both said key switch-initiated Clock signal and a key switch-initiated Clear signal, and wherein each of said two last-mentioned flip-flops is responsive to a different one of said time slot-controlling signals, from said flip-flop coupled to said multivibrator, when applied with both said gated Clock and Clear signals.

4. A time slot-controlling circuit in accordance with claim 2 further including means responsive to at least one of said time slot-controlling signals for providing different visual indications of the duration of each of said two alternating time slot-controlling signals.

5. A time slot-controlled keyboard switch module comprising:
a keyboard module having a plurality of individually actuable key switches;
first means, when voltage biased, for generating at least two repetitive and alternating time slot-controlling signals, each of which is of predetermined duration and logic state, and defines a separate time slot;
second means, including a plurality of channel selector circuit means, each of the latter means producing an output utilization control signal on a time slot associated one of two output channels thereof in response at least conditionally to both a selected one of said time slot-controlling signals and a Clock-defining signal being applied thereto, the latter signal being generated by said second means, and initiated by a pre-selected key switch of said keyboard module being actuated, during a selected time slot, each resulting channel output control signal thereby being representative of an exclusive one of at least two distinct actuated switching states of an associated key switch, and of any visually discernable characters pre-assigned to such an exclusive switching state.

6. A time slot-controlled keyboard switch module in accordance with claim 5 wherein said first means includes a multivibrator and a flip-flop, with the output of said multivibrator toggling said flip-flop such that the latter alternately produces at least said two time slot-controlling signals.

7. A time slot-controlled keyboard switch module in accordance with claim 6 wherein each of said channel selector circuit means includes two flip-flops and gating means, the latter producing both said key switch-initiated Clock signal and a key switch-initiated Clear signal, the former with a predetermined time delay, and wherein each of said two last-mentioned flip-flops is responsive to a different one of said time slot-controlling signals, from said flip-flop coupled to said multivibrator, when applied with both said gated Clock and Clear signals.

8. A time slot-controlled keyboard switch module in accordance with claim 7 further including means responsive to at least one of said time slot-controlling signals for providing different visual indications of the duration of each of said alternating time slot-controlling signals.

9. A time slot-controlled keyboard operated apparatus comprising:
a keyboard module having a plurality of individually actuable key switches;
first means, when voltage biased, for generating at least two repetitive and alternating time slot-controlling signals, each of which is of predetermined duration and logic state, and defines a separate time slot period;
second means, including a plurality of channel selector circuit means, each of the latter means producing an output utilization control signal on a time slot associated one of two output channels thereof in response at least conditionally to both a selected one of said time slot-controlling signals and a Clock-defining signal being applied thereto, the latter signal being generated by said second means, and initiated by a pre-selected key switch of said keyboard module being actuated, during a selected time slot, each resulting channel output control signal thereby being representative of an exclusive one of at least two distinct actuated switching states of an associated key switch, and of any visually discernable characters associated with such an exclusive switching state, and
utilization means responsive to said key switch-initiated channel output control signals, as sequentially applied thereto, for performing work and logic functions, selectively.

10. A time slot-controlled, keyboard-operated apparatus in accordance with claim 9 wherein said utilization device includes a serial-to-parallel digital encoder.

11. A time slot-controlled, keyboard-operated apparatus in accordance with claim 9 wherein said apparatus comprises an electronic telephone, including a housing, transmitter and receiver, and wherein said utilization means comprises an electronic dialer module, including a signal encoder, said module being responsive to said key switch-initiated, and time slot-controlled, channel output control signals, and wherein each of the two time slot-controlled actuable switching states of the keys represent different standard alpha/numeric character groupings that correspond to those normally associated with each pushbutton type key in a telephone having only one actuable switching state for each key.

12. A time slot-controlled, keyboard-operated apparatus in accordance with claim 11 wherein said first means includes a multivibrator and a flip-flop, with the output of said multivibrator toggling said flip-flop such that the latter alternately produces at least said two time slot-controlling signals.

13. A time slot-controlled, keyboard-operated apparatus in accordance with claim 12 wherein each of said channel selector circuit means includes two flip-flops and gating means, the latter producing both said key switch-initiated Clock signal and a key switch-initiated Clear signal, the former with a predetermined time delay, and wherein each of said two last-mentioned flip-flops is responsive to a different one of said time slot-controlling signals, from said flip-flop coupled to said multivibrator, when applied with both said grated Clock and Clear signals.

14. A time slot-controlled, keyboard-operated apparatus in accordance with claim 13 further including means responsive to at least one of said time slot-controlling signals for providing different visual indications of the duration of each of said alternating time slot-controlling signals.

* * * * *